(12) United States Patent
Philpott

(10) Patent No.: US 6,226,562 B1
(45) Date of Patent: May 1, 2001

(54) METHOD AND SYSTEM FOR ADJUSTING AND CALIBRATING CIRCUIT PARAMETERS

(75) Inventor: Rick Allen Philpott, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/150,559

(22) Filed: Sep. 10, 1998

(51) Int. Cl.[7] ...................................................... G06F 19/00
(52) U.S. Cl. ................................ 700/117; 700/3; 700/69; 700/250; 700/258; 700/275; 701/25; 701/220; 324/426; 324/430; 327/103; 327/362; 327/561; 341/118; 341/119; 341/112; 341/167; 708/823
(58) Field of Search ..................................... 700/117, 250, 700/275, 3, 69, 258; 701/25, 220; 324/426, 430; 708/823; 327/103, 362, 561; 341/118–120, 167

(56) References Cited

U.S. PATENT DOCUMENTS 4,092,726 * 5/1978 Schoeff ................................. 708/823
4,881,038 * 11/1989 Champlin ............................. 324/426
5,396,130   3/1995 Galbraith et al. ..................... 326/102

OTHER PUBLICATIONS

Zupancic, A calibration technique in robotic assembly of hybrid circuits, IEEE., pp. 137–146, 1990.*
Michael et al., An automated flip–chip assembly technology for advanced VLSI packaging, IEEE., pp. 335–341, 1988.*
Shieh et al., DC Control and Observation Structures for Analog Circuits., IEEE., pp. 120–123, 1995.*

* cited by examiner

Primary Examiner—William A. Cuchlinski, Jr.
Assistant Examiner—McDieunel Marc
(74) Attorney, Agent, or Firm—Felsman, Bradley, Vaden, Gunter & Dillon, LLP

(57) ABSTRACT

A method and system for calibrating analog integrated circuits. Initially, a single calibration circuit is formed integral with a group of analog integrated circuits. A control signal and a calibration signal are generated from the calibration circuit. Next, the control signal and the calibration signal are selectively coupled to an input of a particular analog integrated circuit among the group of analog integrated circuits. The particular analog integrated circuit is then selected for calibration via the control signal. An output of the particular analog integrated circuit is thereafter observed, in response to enabling the particular analog integrated circuit for calibration via the control signal, such that if an output of the particular analog integrated circuit corresponds to the calibration signal, a successful calibration of the particular analog integrated circuit is indicated, thereby permitting the single calibration circuit to generically calibrate a multitude of diverse analog integrated circuits. The output of the particular analog integrated circuit is coupled to an input of the single calibration circuit, and the calibration value is incremented until the particular analog integrated circuit is calibrated, such that upon completion of the calibration, the calibration value comprises a current calibration value associated with the particular analog integrated circuit. In addition, if the output of the particular analog integrated circuit is composed of a logically high value, then an indication is provided that the particular analog integrated circuit has been successfully calibrated.

14 Claims, 4 Drawing Sheets

METHOD AND SYSTEM FOR ADJUSTING AND CALIBRATING CIRCUIT PARAMETERS

BACKGROUND OF THE INVENTION

1. Technical Field

The present invention relates in general to integrated circuits. In particular, the present invention relates to integrated circuit design. More particularly, the present invention relates to techniques for adjusting and calibrating circuit parameters within an integrated circuit. Still more particularly, the present invention relates to analog integrated circuits and techniques for calibrating and adjusting such circuits.

2. Description of the Related Art

It is desirable to be able to adjust the performance of semiconductor integrated circuits after processing has been completed to minimize variation associated with process tolerance. This adjustment or calibration procedure should be able to be applied to multiple interacting or non-interacting circuits on the same semiconductor die. It is desirable to be able to iterate the adjustment or change particular circuits to counteract changes in circuit performance caused by circuit interaction. For example, if circuit A is calibrated before circuit B and the subsequent calibration of circuit B changes the performance of circuit A, it is desirable to iterate circuit A's calibration. It is also desirable to accomplish this calibration or adjustment without increasing process complexity substantially.

Memory circuits, such as dynamic random access memory (DRAM) and static random access memory (SRAM), have been a prime technology driver for semiconductor processing. As a result, most modern complementary metal oxide semiconductor (CMOS) and BICMOS processes are derivatives of semiconductor processes developed for memories. Most memory circuits have the capability of utilizing the redundancy fuses needed to replace a bad bank of memory on a chip. These fuses can take the form of metal or polysilicon straps or links that are blown with a laser or electrically blown. Because of the price sensitivity of memory, fuse blow processes have been optimized for low cost and equipment to blow the fuses is readily available. However, a problem with utilizing fuses to calibrate integrated circuits is that fuses are not iterative in nature.

Techniques have thus been developed to calibrate circuits, particularly analog integrated circuits, by adjusting fuses at the wafer level. However, such techniques are not useful when calibrating and adjusting circuit parameters for a variety of different analog circuits on a single integrated circuit chip. Analog circuits possess varying degrees of sensitivity to technology variations and packaging mechanical stresses which results in non-optimum circuit performance. The performance of analog circuits can be improved by adding calibration circuitry to each analog circuit that adjusts and cancels out technology variations. However, the number of analog circuits can be quite large and often results in several circuits needing calibration. Based on the foregoing, it can be appreciated that what is needed to successfully calibrate a variety of diverse analog circuits on a single chip is a method and system that avoids the use of fuse adjustment calibration techniques and an overabundance of calibration circuitry. To minimize chip size and cost, what is needed is a generic calibrate circuit or engine that can be utilized to calibrate all analog circuits on a single integrated circuit chip.

SUMMARY OF THE INVENTION

It is therefore an object of the present invention to provide an improved method and system for calibrating integrated circuits.

It is another object of the present invention to provide an improved method and system for calibrating analog integrated circuits.

It is yet another object of the present invention to provide an improved method and system for calibrating and adjusting analog integrated circuits.

It is still another object of the present invention to provide a generic calibration circuit that may be integrated and utilized to calibrate and adjust a variety of diverse analog integrated circuits on a single integrated circuit chip.

The above and other objects are achieved as is now described. A method and system for calibrating analog integrated circuits are disclosed. Initially, a single calibration circuit is formed integral with a group of analog integrated circuits. A control signal and a calibration signal are generated from the calibration circuit. Next, the control signal and the calibration signal are selectively coupled to an input of a particular analog integrated circuit among the group of analog integrated circuits. The particular analog integrated circuit is then enabled for calibration via the control signal. An output of the particular analog integrated circuit is thereafter observed, in response to enabling the particular analog integrated circuit for calibration via the control signal, such that if an output of the particular analog integrated circuit corresponds to the calibration signal, a successful calibration of the particular analog integrated circuit is indicated, thereby permitting the single calibration circuit to generically calibrate a multitude of diverse analog integrated circuits. Thereafter, at least one other analog integrated circuit among the group of integrated circuits may be calibrated. The output of the particular analog integrated circuit is coupled to an input of the single calibration circuit, and the calibration value is incremented until the particular analog integrated circuit is calibrated, such that upon completion of the calibration, the calibration value comprises a current calibration value associated with the particular analog integrated circuit. In addition, if the output of the particular analog integrated circuit is composed of a logically high value, then an indication is provided that the particular analog integrated circuit has been successfully calibrated.

BRIEF DESCRIPTION OF THE DRAWINGS

The novel features believed characteristic of this invention are set forth in the appended claims. The invention itself, however, as well as a preferred mode of use, further objects, and advantages thereof, will best be understood by reference to the following detailed description of a preferred embodiment when read in conjunction with the accompanying drawings, wherein:

DESCRIPTION OF PREFERRED EMBODIMENT

Figure 1:
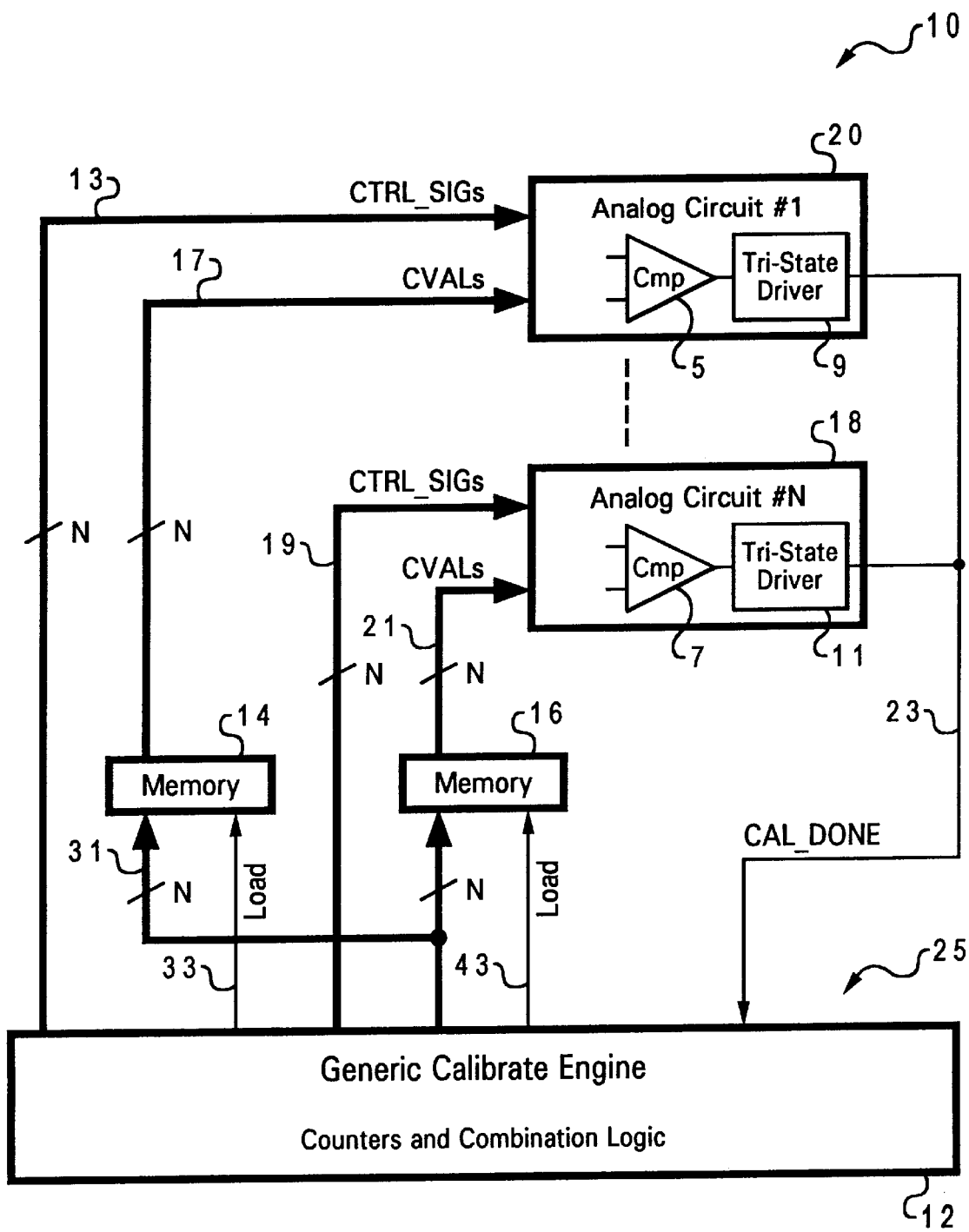
FIG. 1 illustrates a high-level block diagram illustrative of a generic calibration circuit and associated analog circuitry, which may be utilized to implement a preferred embodiment of the present invention.

With reference now to the figures and in particular with reference to FIG. 1, there is depicted a high-level block diagram 10 of a generic calibration circuit 12 and associated analog circuitry, which may be utilized to implement a preferred embodiment of the present invention. The circuits to be calibrated are represented by analog circuit 20 and analog circuit 18. Although only two sets of analog circuits are depicted in FIG. 1, those skilled in the art will appreciate that a variety of other analog circuits, of diverse design and purpose, may be utilized in accordance with a preferred embodiment of the present invention. The circuits to be calibrated receive a set of control signals (CTRL_SIGs) and a calibration value (CVALs) from the logic contained within generic calibration circuit 12. The control signals are depicted at arrows 13 and 19, while the calibrate value is depicted at arrows 17 and 21. The control signals depicted at arrow 13 are input to analog circuit 20, while the control signals depicted at arrow 19 are input to analog circuit 18. The calibrate value illustrated at arrow 17 is input to analog circuit 20, and the calibrate value illustrated at arrow 21 is input to analog circuit 18. The calibrate value is composed of one or more calibration signals generated by generic calibration circuit 12.

The control signals enable the analog circuits for calibration. The analog circuit under calibration will output a logical "1" at the "calibration done" line 23 when the analog circuit has received an optimal calibration value. The "calibration done"(CAL_DONE) line 23 is input to generic calibration circuit 12, as depicted by reference numeral 25. When a "calibration done" logical value of "1" appears at the CAL_DONE line, an indication is provided to logical circuitry within generic calibration circuit 12 to stop the calibration.

The calibration values (CVALs) are outputs from memory blocks. The memory blocks receive a common N-bit calibrate value signal 31 from generic calibration circuit 12. Generic calibration circuit 12 also outputs "load" signals to each memory block, which causes the calibrate value 31 to be stored. When analog circuit 18 is being calibrated, memory block 16 is loaded with new calibration values, as indicated by "load" signal 43. An analogous operation is performed relative to circuit 20. Calibration values are stored in memory block 14 which receives "load" signal 33. When a "CAL_DONE" logical signal value of "1" is input to generic calibration circuit 12, corresponding to a successful calibration of analog circuit 20, the current calibrate value in memory 14 will no longer be updated. Likewise, when a "CAL_DONE" logical signal value of "1" is input to generic calibration circuit 12, analog circuit 18 has completed a successful calibration, and the calibrate value in memory 16 will no longer be updated. In FIG. 1, generic calibration circuit 12, represented as a block labeled "Generic Calibrate Engine," includes Counters and Combination Logic, all well known in the art of integrated circuit design.

Generic calibration circuit 12 can be utilized to calibrate and adjust circuit parameters for a variety of different analog integrated circuits. Each analog integrated circuit (e.g., analog circuit 12 and analog circuit 18) contains an analog comparator and a tri-state driver, which in turn is coupled to the CAL_DONE line. For example, analog circuit 20 includes an analog comparator 5, along with a tri-state driver 9, that connects to CAL_DONE line 23. Similarly, analog circuit 18 includes an analog comparator 7, along with a tri-state driver 11, that connects to CAL_DONE line 23. The analog comparator and the tri-state driver are only enabled during that particular analog circuit's calibration interval. During a non-calibration period, the comparator is disabled and the tri-state driver remains at a high impedance mode for a particular analog integrated circuit. Thus, only a single common CAL_DONE signal is sent to the logic circuitry within generic calibration circuit 12 for any number of analog circuits to be calibrated. The aforementioned analog comparators and tri-state drivers, of course, are described in the context of a single preferred embodiment of the present invention. Other techniques may also be utilized to generate a CAL_DONE signal. For example, the configuration depicted in FIG. 2 ilustrates an alternative technique for generating a CAL_DONE signal without the need for tri-state drivers in the analog circuitry.

Figure 2:
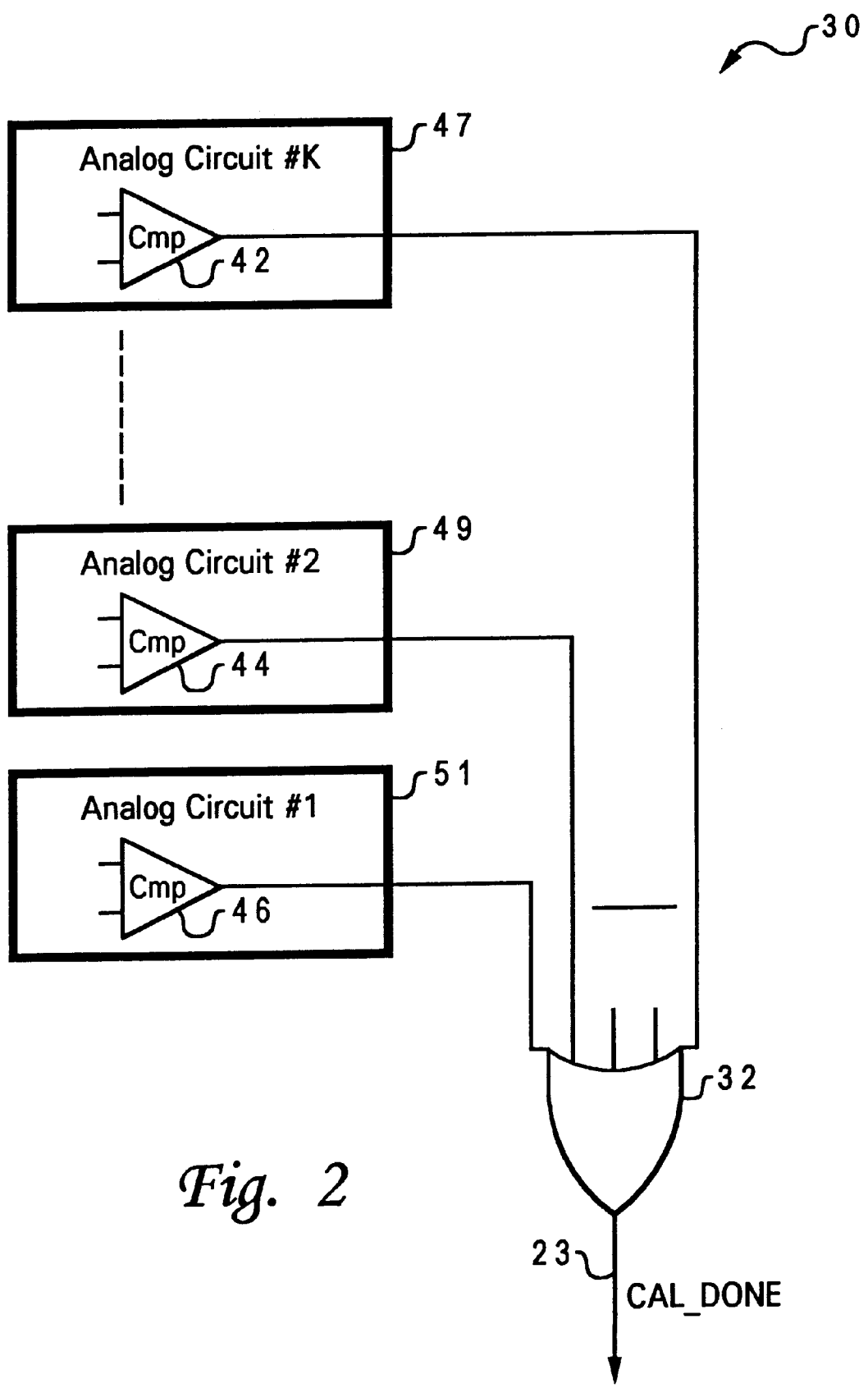
FIG. 2 depicts a high-level block diagram illustrative of alternative circuitry for generating calibration signals, in accordance with a preferred embodiment of the present invention.

FIG. 2 illustrates a high level block diagram 30 illustrating a technique for generating a CAL_DONE signal utilizing a logical OR gate and no tri-state drivers, in accordance with a preferred embodiment of the present invention. Each analog integrated circuit contains an analog comparator with a logical output signal that connects to OR gate 32. The output of OR gate 32 generates CAL_DONE signal 23. When the analog comparator outputs a logical signal value of "1", that analog comparator circuit has completed a successful calibration and the CAL_DONE signal will also provide a logical signal value of "1". For example, analog circuit 51 includes an analog comparator 46 that connects to one input of OR gate 32. Similarly, analog circuits 47 and 49 include analog comparators 42 and 44 respectively which connect to OR gate 32. The analog comparator is only enabled during that particular analog circuit's calibration interval, which permits the analog comparator to output a logical value of "1" also. During a non-calibration period, the analog comparator is disabled and outputs a logical value of "0".

Figure 3:
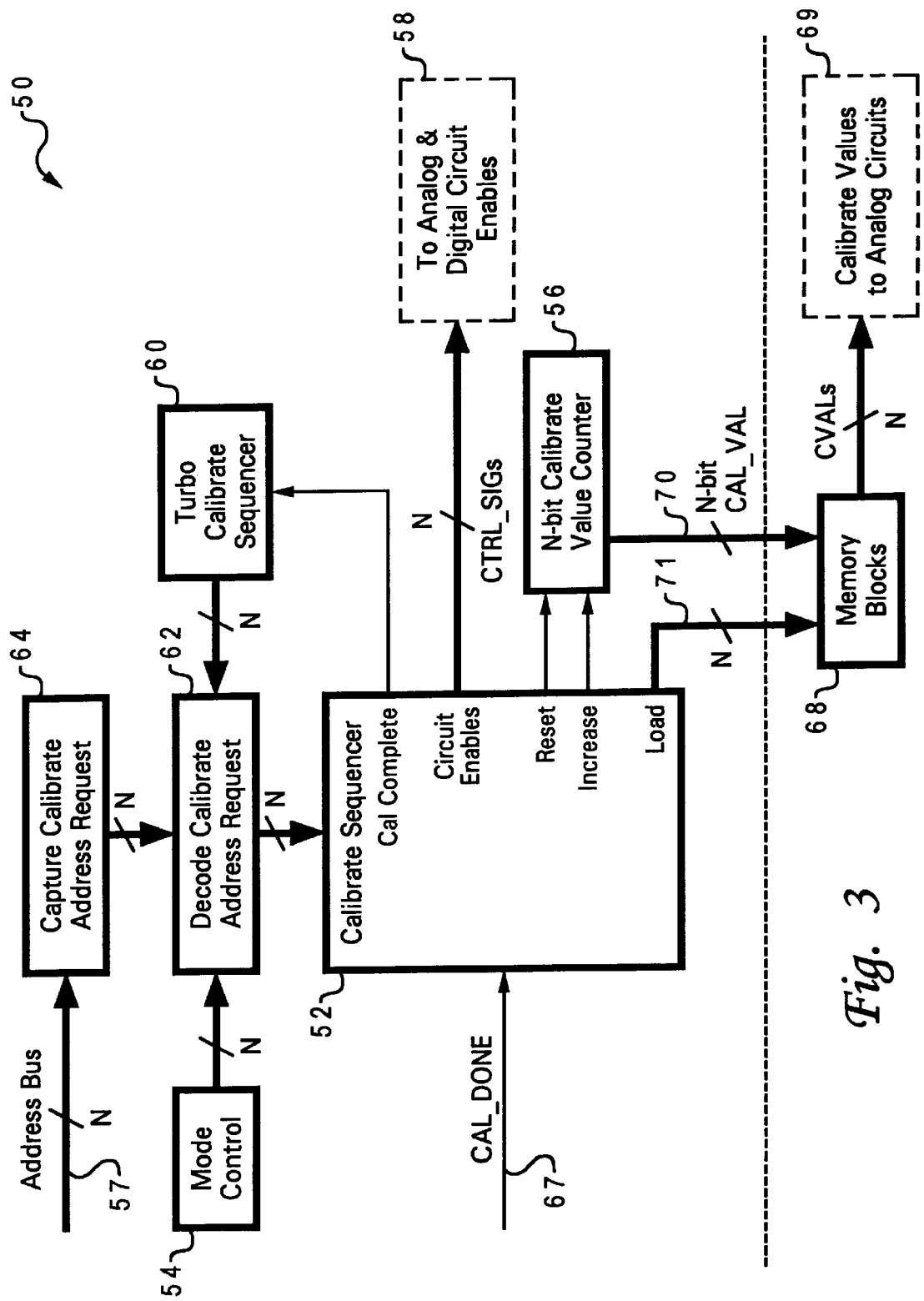
FIG. 3 illustrates a high-level block diagram illustrative of the generic calibration circuit illustrated in FIG. 1, in accordance with a preferred embodiment of the present invention.

FIG. 3 depicts a high-level block diagram 50 illustrative of the generic calibration circuit 12 illustrated in FIG. 1, in accordance with a preferred embodiment of the present invention. High-level block diagram 50 depicts a more detailed view of the components within generic calibration circuit 12. The memory blocks 68 receive an N-bit CAL_VAL signal 70 from the N-bit calibrate value counter 56. In addition, memory blocks 68 receive an N-bit load signal 71 that indicates which block and/or blocks are to be loaded with the current CAL_VAL. Data output (CVALs) from memory blocks 68 are fed to the analog circuits 69.

A calibrate routine is initiated when capture address request circuit 64 captures an address from address bus 57. The output of capture calibrate address request circuit 64 is connected to the input of decode calibrate address request circuit 62. Two other inputs to calibrate address request circuit 62 are necessary, including the output of mode control circuit 54, and the output from turbo calibrate sequencer circuit 60. Output from decode calibrate address request circuit 62 is input to calibration sequencer circuit 52. A calibration complete output signal (Cal Complete) is fed as input to turbo calibrate sequencer circuit 60. An N-bit output bus (Circuit Enables) is fed as output from calibration sequencer 52 to enable the appropriate analog and digital circuits 58 during a calibration. A reset output (Reset) is provided as output from the calibration sequencer circuit 52 and fed as input to the N-bit calibrate value counter circuit 56. Finally a "CAL_DONE" signal 67 is provided as input to calibration sequencer circuit 52.

Mode control circuit 54 controls the manner in which the generic calibrate engine (e.g., see block 12 in FIG. 1) corresponds to a calibrate request. Mode control circuit 54 can be utilized to select different calibrate value counter routines and is not limited to binary up count, binary down count, and successive approximation counting. Mode control circuit 54 can also function to change the amount of wait time between updating calibration values and checking CAL_DONE signal 67. Thus, if different analog circuits have various settling times when the calibration value is adjusted, the generic calibrate engine described and illustrated herein can be adjusted to accommodate the various settling times.

Figure 4:
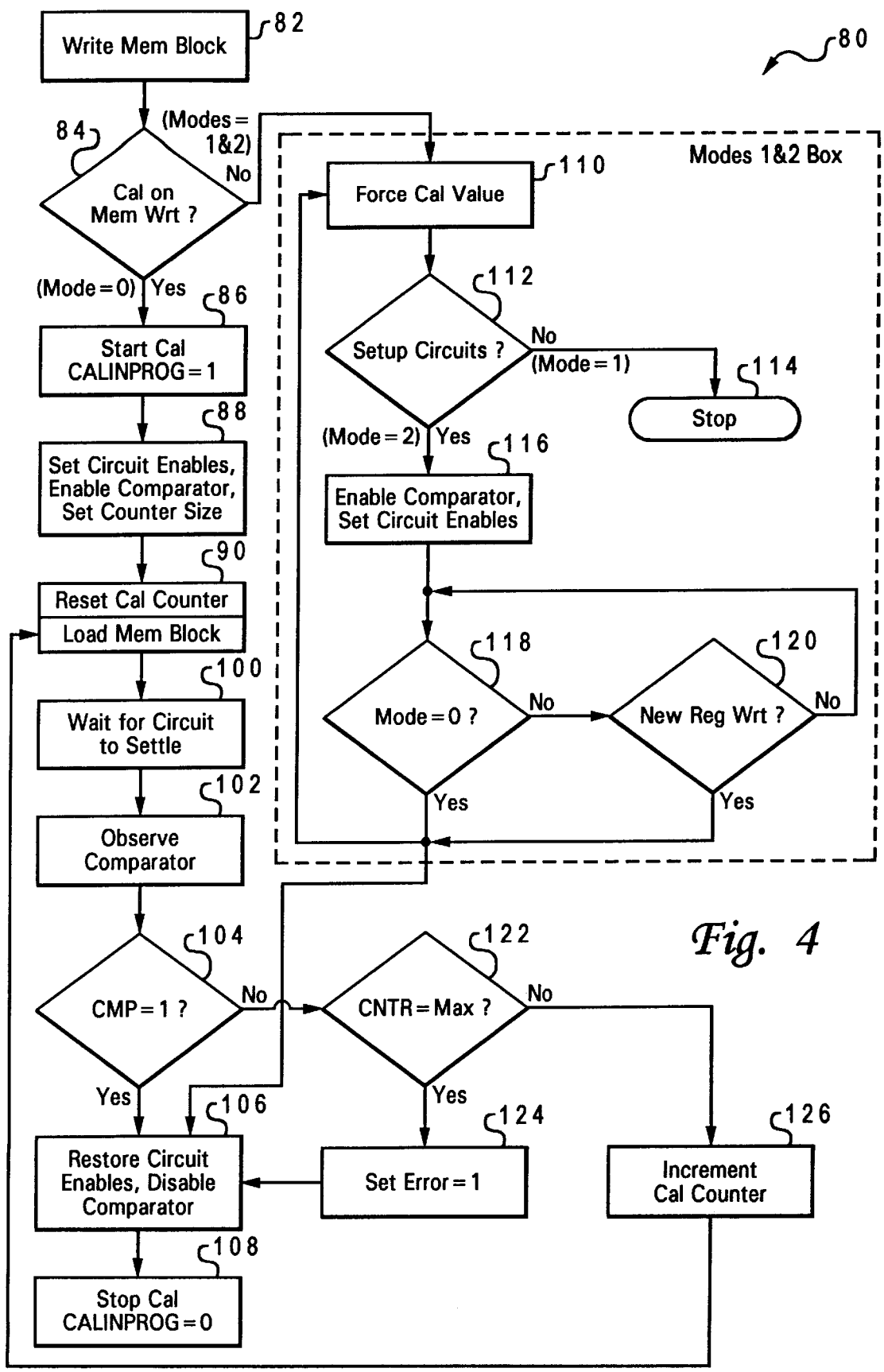
FIG. 4 depicts a high-level logic flow diagram that may be utilized to carry out a preferred embodiment of the present invention.

FIG. 4 illustrates a logic flow diagram 80 that shows steps used to carry out the method and system of the present invention, according to a preferred embodiment of the present invention. It can be appreciated by those skilled in the art that FIG. 4 presents a self-consistent sequence of steps leading to a desired result. The steps are those requiring physical manipulation of physical quantities. Usually, although not necessarily, these quantities take the form of electrical or magnetic signals capable of being stored, transferred, combined, compared, and otherwise manipulated. It has proven convenient at times by those skilled in the art, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as "enabling" or "generating," which are commonly associated with mental operations performed by a human operator. No such capability of a human operator is necessary or desirable in most cases in any of the operations described herein which form part of the present invention; the operations are machine operations. Useful machines for performing operations of a preferred embodiment of the present invention include data-processing systems such as general purpose digital computers or other similar devices. In all cases the distinction between the method operations in operating a computer and the method of computation itself should be borne in mind.

Thus, as indicated at block 82, particular values are written to a calibration memory block. As illustrated thereafter at decision block 84, a test is performed to determine if calibration values have been written to the calibration memory block. If not, then as depicted beginning at block 110, a mode labeled "1" and "2" is initiated. If so, then as depicted beginning at block 86, a mode labeled "0" is initiated. If the process continues to modes 1 and 2, then as indicated at block 110, a calibration value is forced. As described next at decision block 112, a test is performed to determine whether or not to set up the circuits. If a decision is made not to setup the circuits, then the process terminates (mode 1), as depicted at block 114. However, if a decision is made to set up the circuits, then the comparator circuit of an analog circuit to be calibrated is enabled (mode 2), as indicated at block 116. Thereafter, as illustrated at decision block 118, a test is performed whether or not to continue processing within the operating environment of modes 1 and 2. Modes 1 and 2 can be utilized for testing of calibration verification.

If a decision is made to continue functioning within the operating environment of modes 1 and 2, then as indicated at block 120, another test is performed. This time, a test is performed to determine whether or not to write data to a new register. If not, then the operation illustrated at block 118 is repeated. If so, then the operations depicted, beginning at block 110 and thereafter, are also repeated. If it is determined, as indicated at block 118, to leave the environment of mode 1 and 2, then the process continues, as illustrated at block 106 in which circuit enables are restored and the comparator is disabled. If, as depicted at block 84, it is determined not to enter the operating environment of modes 1 and 2, and to continue operating within the mode 0 processing environment, then as indicated at block 86, the calibration is initiated with a "calibration in progress" value of "1" (CALINPROG=1).

Thereafter, as illustrated at block 88 the circuit enables are set. The comparator is enabled and the counter size is also set. As depicted next at block 90, the calibration counter is reset and the memory block is loaded. Thereafter, as described at block 100, a wait operation is performed to allow the analog circuit time to settle with the new calibrate value. The comparator is then observed, as illustrated at block 102. As indicated thereafter at decision block 104, if the comparator output is equivalent to a "1" value, the circuit enables are subsequently restored and the comparator disabled, as illustrated at block 106.

Following processing of the operation depicted at block 106, the calibration is stopped and the calibration program value is set to a value of "0" (CALINPROG=0), as illustrated at block 108. If, however, the comparator value is not equivalent to a "1" value, then as described at decision block 122, a test is performed to determine whether or not the counter has been set to a maximum value (CNTR=Max). If the counter is equal to a maximum value, then an "ERROR" value is set equivalent to a value of "1," as illustrated at block 124. If, however, the counter is not equal to a maximum value, as indicated at block 122, then as depicted at block 126, the calibration counter is incremented. Following incrementing the calibration counter, as illustrated at block 126, the operations performed beginning as indicated at block 90 are repeated.

Thus, a method and system for calibrating analog integrated circuits are illustrated and discussed herein. Initially, a single calibration circuit can be formed integral with a group of analog integrated circuits. A control signal and a calibration signal are generated from the calibration circuit. Next, the control signal and the calibration signal are selectively coupled to an input of a particular analog integrated circuit among the group of analog integrated circuits of varying size, shape and strength. The particular analog integrated circuit is then enabled for calibration via the control signal. An output of the particular analog integrated circuit is thereafter observed, in response to enabling the particular analog integrated circuit for calibration via the control signal, such that if an output of the particular analog integrated circuit corresponds to the calibration signal, a successful calibration of the particular analog integrated circuit is indicated, thereby permitting the single calibration circuit to generically calibrate a multitude of diverse analog integrated circuits.

The output of the particular analog integrated circuit is coupled to an input of the single calibration circuit, and the calibration value is incremented until the particular analog integrated circuit is calibrated, such that upon completion of the calibration, the calibration value comprises a current calibration value associated with the particular analog integrated circuit. In addition, if the output of the particular analog integrated circuit is composed of a logically high value, then an indication is provided that the particular analog integrated circuit has been successfully calibrated. Those skilled in the art can thus appreciate that by utilizing the method and system described herein, an integrated generic calibrate engine may be implemented that allows analog circuits to be calibrated at the waver level and again at the module package level. Calibrating at the module level eliminates any effort of mechanical stress from packaging that affects circuit performance. The use of such a generic calibrate circuit or engine minimizes chip size and reduces the cost of calibrating all analog circuits within a given integrated circuit chip.

The embodiments and examples set forth herein are presented in order to best explain the present invention and its practical application and, thereby, to enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A method for calibrating analog integrated circuits, said method comprising the steps of:

forming a single calibration circuit integral with a plurality of analog integrated circuits;

generating a control signal and a calibration signal from said single calibration circuit;

selectively coupling said control signal and said calibration signal to an input of a particular analog integrated circuit among said plurality of analog integrated circuits, enabling only said particular analog integrated circuit for calibration via said control signal;

observing an output of said particular analog integrated circuit, in response to enabling said particular analog integrated circuit for calibration via said control signal, such that if an output of said particular analog integrated circuit corresponds to said calibration signal, a successful calibration of said particular analog integrated circuit is indicated; and thereafter calibrating at least one other analog integrated circuit among said plurality of analog integrated circuits.

2. The method of claim 1 further comprising the step of:

coupling said output of said particular analog integrated circuit to an input of said single calibration circuit.

3. The method of claim 2 further comprising the step of:

incrementing said calibration value until said particular analog integrated circuit is calibrated, such that upon completion of said calibration, wherein said calibration value comprises a current calibration value associated with said particular analog integrated circuit.

4. The method of claim 1 further comprising the step of:

indicating that said particular analog integrated circuit is calibrated, if said output of said particular analog integrated circuit is composed of a logically high value.

5. The method of claim 4 further comprising the step of:

storing within a parameter memory, said current calibration value associated with said particular analog integrated circuit, in response to an indication that said particular analog circuit is calibrated.

6. The method of claim 5 further comprising the steps of:

configuring said plurality of analog integrated circuits such that each analog integrated circuit among said plurality of analog integrated circuits comprises a comparator having a tri-state output; and generating an output of a particular analog integrated circuit from a tri-state output of a comparator within said particular analog integrated circuit.

7. The method of claim 5 further comprising the steps of:

configuring said plurality of analog integrated circuits such that each analog integrated circuit among said plurality of analog integrated circuits comprises a comparator based on a logical OR configuration; and generating an output of a particular analog integrated circuit from said logical OR configuration of said comparator within said particular analog integrated circuit, wherein said output indicates that said particular analog integrated circuit is calibrated, if said output is composed of a logically high value.

8. A system for calibrating analog integrated circuits, said system comprising:

means for forming a single calibration circuit integral with a plurality of analog integrated circuits;

means for generating a control signal and a calibration signal from said single calibration circuit;

means for selectively coupling said control signal and said calibration signal to an input of a particular analog integrated circuit among said plurality of analog integrated circuits, means for enabling only said particular analog integrated circuit for calibration via said control signal;

means for observing an output of said particular analog integrated circuit, in response to enabling said particular analog integrated circuit for calibration via said control signal, such that if an output of said particular analog integrated circuit corresponds to said calibration signal, a successful calibration of said particular analog integrated circuit is indicated; and means for thereafter calibrating at least one other analog integrated circuit among said plurality of analog integrated circuits.

9. The system of claim 8 further comprising:

means for coupling said output of said particular analog integrated circuit to an input of said single calibration circuit.

10. The system of claim 9 further comprising:

means for incrementing said calibration value until said particular analog integrated circuit is calibrated, such that upon completion of said calibration, wherein said calibration value comprises a current calibration value associated with said particular analog integrated circuit.

11. The system of claim 10 further comprising:

means for indicating that said particular analog integrated circuit is calibrated, if said output of said particular analog integrated circuit is composed of a logically high value.

12. The system of claim 11 further comprising:

means for storing within a parameter memory, said current calibration value associated with said particular analog integrated circuit, in response to an indication that said particular analog circuit is calibrated.

13. The system of claim 12 further comprising:

means for configuring said plurality of analog integrated circuits such that each analog integrated circuit among said plurality of analog integrated circuits comprises a comparator having a tri-state output; and means for generating an output of a particular analog integrated circuit from a tri-state output of a comparator within said particular analog integrated circuit.

14. The system of claim 12 further comprising:

means for configuring said plurality of analog integrated circuits such that each analog integrated circuit among said plurality of analog integrated circuits comprises a comparator based on a logical OR configuration; and means for generating an output of a particular analog integrated circuit from said logical OR configuration of said comparator within said particular analog integrated circuit, wherein said output indicates that said particular analog integrated circuit is calibrated, if said output is composed of a logically high value.

* * * * *